(12) United States Patent
Xu et al.

(10) Patent No.: US 12,131,495 B2
(45) Date of Patent: Oct. 29, 2024

(54) INITIAL DISPLAY SUBSTRATE, INITIAL DISPLAY PANEL, DISPLAY PANEL AND INSPECTION METHOD THEREOF

(71) Applicants: Fuzhou BOE Optoelectronics Technology Co., Ltd., Fujian (CN); BOE TECHNOLOGY GROUP CO., LTD., Beijing (CN)

(72) Inventors: Xu Xu, Beijing (CN); Biqiang Huang, Beijing (CN); Shanshan Xu, Beijing (CN); Wenchao Wang, Beijing (CN); Jixiang Chen, Beijing (CN); Longgan Hu, Beijing (CN)

(73) Assignees: Fuzhou BOE Optoelectronics Technology Co., Ltd., Fujian (CN); BOE TECHNOLOGY GROUP CO., LTD., Beijing (CN)

(*) Notice: Subject to any disclaimer, the term of this patent is extended or adjusted under 35 U.S.C. 154(b) by 484 days.

(21) Appl. No.: 17/486,580

(22) Filed: Sep. 27, 2021

(65) Prior Publication Data
US 2022/0245845 A1 Aug. 4, 2022

(30) Foreign Application Priority Data
Feb. 2, 2021 (CN) .......................... 202110146037.5

(51) Int. Cl.
*G06T 7/60* (2017.01)
*H10K 50/86* (2023.01)
(Continued)

(52) U.S. Cl.
CPC ............. *G06T 7/60* (2013.01); *H10K 50/865* (2023.02); *H10K 71/00* (2023.02); *H10K 71/70* (2023.02); *G02F 1/1309* (2013.01)

(58) Field of Classification Search
CPC ........ G06T 7/60; H10K 50/865; H10K 71/00; H10K 71/70; H10K 50/844; H10K 59/126;
(Continued)

(56) References Cited

U.S. PATENT DOCUMENTS 6,001,203 A * 12/1999 Yamada ................. C09J 163/10
349/190
2007/0077847 A1 * 4/2007 Hirata .................... B65D 85/38
445/24

(Continued)

*Primary Examiner* — Ali Bayat
(74) *Attorney, Agent, or Firm* — HOUTTEMAN LAW LLC

(57) ABSTRACT

An initial display substrate comprising a product region and a to-be-processed region on periphery of the product region, the to-be-processed region comprising to-be-processed rounded corner regions at corners of the initial display substrate, each corner comprising major corner sides whose extension directions intersect, at least one to-be-processed rounded corner region comprising first positioning sub-region and two second positioning sub-regions, the major corner sides respectively defining edges of the second positioning sub-regions, the first positioning sub-region being between the second positioning sub-regions; first shielding blocks in the first positioning sub-region, each having arc shape protruding towards direction away from the product region, and the first shielding blocks being arranged in parallel at intervals; and second shielding blocks in each second positioning sub-region, the second shielding blocks being arranged in periodic pattern different from pattern of shielding blocks in a region of the to-be-processed region other than the to-be-processed rounded corner regions.

15 Claims, 4 Drawing Sheets

(51) Int. Cl.
*H10K 71/00* (2023.01)
*H10K 71/70* (2023.01)
*G02F 1/13* (2006.01)

(58) Field of Classification Search
CPC . H10K 59/00; G02F 1/1309; G02F 1/133388; G02F 1/133512; G02F 1/1333; G01B 11/08; G01B 11/26
USPC .......................................................... 382/141
See application file for complete search history.

(56) References Cited

U.S. PATENT DOCUMENTS

| | | | |
|---|---|---|---|
| 2010/0033191 A1* | 2/2010 | Lee | G01R 31/001 324/555 |
| 2015/0235913 A1* | 8/2015 | In | H01L 27/124 257/48 |
| 2019/0208642 A1* | 7/2019 | Eun | G06F 1/1658 |
| 2021/0202658 A1* | 7/2021 | Shim | H10K 59/131 |

* cited by examiner

INITIAL DISPLAY SUBSTRATE, INITIAL DISPLAY PANEL, DISPLAY PANEL AND INSPECTION METHOD THEREOF

CROSS-REFERENCE TO RELATED APPLICATION

This application claims priority to Chinese Patent Application No. 202110146037.5, filed on Feb. 2, 2021, the disclosure of which is incorporated by reference herein in its entirety.

TECHNICAL FIELD

The present disclosure relates to the field of display device, and particularly, to an initial display substrate, an initial display panel including the initial display substrate, a display panel, and an inspection method of the display panel.

BACKGROUND

With the development of display technology, narrow-bezel, even frameless, display device has appeared. However, a white edge exists at a periphery of a display panel of the frameless display device, which affects the aesthetic appearance of the product.

To solve this problem, it is common practice to provide a shielding pattern on the display panel to visually eliminate the white edge.

In order to avoid the display panel from generating fragments due to collision in the transportation process, a corner of the display panel are usually ground into a rounded corner. Because the shielding pattern is disposed on the display panel as described above, when the initial display panel is ground, the distance between the shielding pattern for shielding the white edge and the black matrix of a display region in the display panel cannot be determined, and it cannot be accurately determined whether the ground rounded corner can reach the required size, which leads to inconsistent sizes of rounded corners of different products, thereby affecting the product quality.

SUMMARY

The disclosure provides an initial display substrate, an initial display panel comprising the initial display substrate, a display panel and an inspection method of the display panel.

As a first aspect of the present disclosure, there is provided an initial display substrate including:

a product region and a to-be-processed region disposed at a periphery of the product region, the to-be-processed region including a plurality of to-be-processed rounded corner regions which are respectively disposed at a plurality of corners of the initial display substrate, each of the plurality of corners including two major corner sides whose extending directions intersect with each other, at least one of the plurality of processing rounded corner regions including a first positioning sub-region and two second positioning sub-regions, the two major corner sides respectively defining outer edges of the two second positioning sub-regions, and the first positioning sub-region being disposed between the two second positioning sub-regions;

a plurality of first shielding blocks disposed in the first positioning sub-region, each first shielding block having an arc shape protruding towards a direction facing away from the product region, and the plurality of first shielding blocks being disposed in parallel at intervals; and a plurality of second shielding blocks disposed in each of the two second positioning sub-regions, the plurality of second shielding blocks being arranged in a periodic pattern different from a pattern of the shielding blocks located in a region of the to-be-processed region other than the plurality of to-be-processed rounded corner regions.

In some embodiments, in the two second positioning sub-regions, the plurality of second shielding blocks include a plurality of first rectangular shielding blocks and a plurality of second rectangular shielding blocks, the plurality of first rectangular shielding blocks are arranged along a corresponding major corner side and spaced apart from each other, at least one of the second rectangular shielding block is disposed between adjacent two first rectangular shielding blocks of the plurality of first rectangular shielding blocks, a spacing between adjacent two first rectangular shielding blocks is smaller than a width of each of the plurality of first rectangular shielding blocks, and a width direction of the plurality of first rectangular shielding blocks is consistent with a direction of a major corner side corresponding to a second positioning sub-region where the plurality of first rectangular shielding blocks are located.

In some embodiments, the plurality of second rectangular shielding blocks are disposed between adjacent ones of the plurality of first rectangular shielding blocks, and the plurality of second rectangular shielding blocks are arranged in a direction perpendicular to the corresponding major corner side and spaced apart from each other.

In some embodiments, each of the plurality of first rectangular shielding blocks has a width between 40 μm and 60 μm and each of the plurality of first rectangular shielding blocks has a length between 100 μm and 200 μm.

In some embodiments, a spacing between adjacent ones of the plurality of first rectangular shielding blocks is between 10 μm and 15 μm.

In some embodiments, the plurality of first shielding blocks are arranged at equal intervals in the same first positioning sub-region.

In some embodiments, a spacing between adjacent ones of the plurality of first shielding blocks is between 10 μm and 15 μm.

In some embodiments, a pitch of the plurality of first shielding blocks is between 45 μm and 55 μm in the same first positioning sub-region.

In some embodiments, 5 to 10 first shielding blocks are provided in the same first positioning sub-region.

In some embodiments, the at least one to-be-processed rounded corner region further includes an auxiliary shielding block arrangement sub-region located between the first positioning sub-region and a vertex of the corresponding corner, and the auxiliary shielding block arrangement sub-region is provided with non-rectangular first auxiliary blocks.

In some embodiments, the corner of the initial display substrate further includes two auxiliary corner edges with intersecting extension directions to form a positioning notch corner with a vertex protruding towards the product region at the corner of the initial display substrate, and the vertex of the positioning notch corner is an intersection of the two auxiliary corner edges.

In some embodiments, the vertex of the positioning notch corner is located within the first positioning sub-region, and the first shielding block located outside the vertex of the positioning notch corner is divided into a first arc-shaped shielding block and a second arc-shaped shielding block by the positioning notch corner.

As a second aspect of the present disclosure, there is provided an initial display panel including an initial display substrate and an initial counter substrate aligned with and opposite to the initial display substrate, the initial display substrate being the initial display substrate provided in the first aspect of the present disclosure.

As a third aspect of the present disclosure, there is provided a method for inspecting a display panel, the display panel being a display panel obtained by removing a portion of the at least one processing rounded corner region from the initial display substrate provided in the second aspect of the present disclosure and removing a corresponding portion of the initial counter substrate, the method including:

acquiring an image of the rounded corner region of the display panel;

determining positions of remaining second shielding blocks in the image obtained by removing a portion of material of the plurality of second shielding blocks;

determining a radius of an edge circular arc of the rounded corner region according to a position of one of the remaining second shielding blocks closest to the edge circular arc of the rounded corner region; and determining whether the rounded corner region is qualified or not according to the radius of the edge circular arc of the rounded corner region.

As a fourth aspect of the present disclosure, there is provided a display panel including a display substrate and a counter substrate aligned with and opposite to the display substrate, the display substrate including:

a display region and a peripheral region disposed around the display region, the peripheral region including a plurality of rounded corner regions respectively disposed at a plurality of corners of the display substrate, each of the plurality of corners including two major corner sides whose extending directions intersect, at least one of the plurality of rounded corner regions including a final first positioning sub-region and two final second positioning sub-regions, the two major corner sides respectively defining outer edges of the two final second positioning sub-regions, the final first positioning sub-region being disposed between the two final second positioning sub-regions;

at least one first shielding block disposed in the final first positioning sub-region, the at least one first shielding block having an arc shape protruding towards a direction facing away from the display region, and a radian of the at least one first shielding block being consistent with a radian of an edge circular arc of a corresponding one of rounded corner regions; and a plurality of remaining second shielding blocks disposed in the two final second positioning sub-regions, the plurality of remaining second shielding blocks being arranged in a periodic pattern different from a pattern of shielding blocks located in a region of the peripheral region other than the plurality of rounded corner regions.

BRIEF DESCRIPTION OF DRAWINGS

The accompanying drawings, which constitute a part of this specification, are provided for further understanding of the disclosure, and for explaining the present disclosure together with the following detailed description, but not intended to limit the present disclosure. In the drawings.

DETAILED DESCRIPTION

Hereinafter, the detailed description of the embodiments of the disclosure will be described in detail with reference to the accompanying drawings. It should be understood that the detailed description are merely used to illustrate and explain the disclosure, but not to limit the present disclosure.

It is found by the inventors of the present disclosure through repeated research that, the reasons for the inconsistency of the sizes of rounded corners of different products are mainly the following two reasons:

Firstly, because a periphery of the initial panel is covered by an independent shielding block, the size and the range of a ground rounded corner cannot be clearly determined when the corner of the initial panel is ground;

Secondly, when detecting whether the diameter of the obtained rounded corner is qualified after the grinding is finished, an end point position of the edge circular arc of the rounded corner is determined by obtaining an image of the rounded corner and then performing image recognition, and the radius of the edge circular arc is calculated according to the end point position. Because a shape of the shielding block at the rounded corner is the same as that of the shielding block at the right-angle side region, the inspection device cannot accurately determine the boundary of the edge circular arc of the rounded corner and the diameter of the rounded corner obtained by grinding, and therefore it is impossible to determine whether the rounded corner obtained by grinding meets the process requirements.

Figure 1:
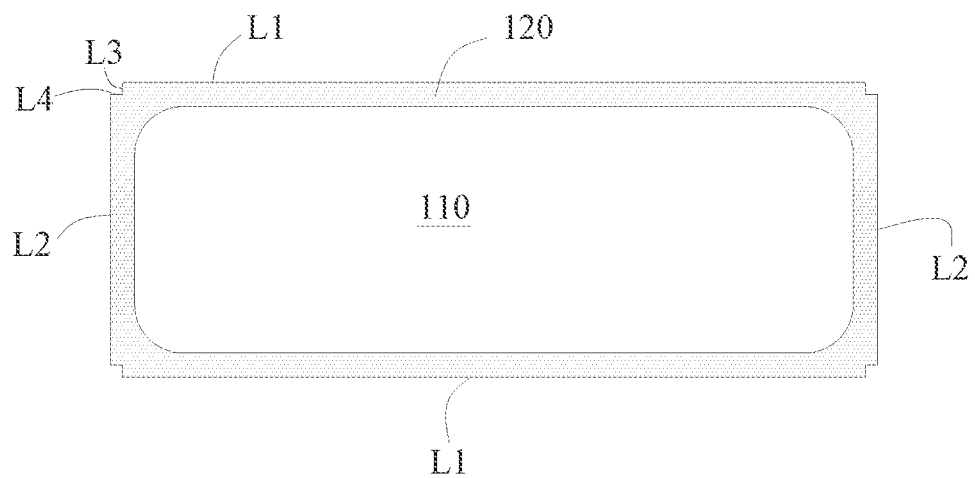
FIG. 1 is a schematic structural diagram of an initial display substrate according to an embodiment of the present disclosure.

In view of this, as a first aspect of the present disclosure, there is provided an initial display substrate. As shown in FIG. 1, the initial display substrate includes a product region 110 and a to-be-processed region 120 disposed at a periphery of the product region 110. The to-be-processed region 120 includes a plurality of processing rounded corner regions respectively provided at a plurality of corners of the initial display substrate, each of the plurality of corners include two major corner sides (major corner side L1 and major corner side L2, respectively, in FIG. 2) whose extending directions intersect. It should be noted that the term "major corner side" refers to an edge of the initial display substrate parallel to an edge of an outer contour of the product region 110, and major corner sides of the plurality of corners intersect or extension lines of the major corner sides intersect to form a closed pattern, and the product region 110 is located inside the closed pattern. For example, in the embodiment shown in FIG. 1, if the outer contour of the product region 110 is substantially rectangular, the initial display substrate includes four major corner sides that are respectively parallel to four sides of the product region 110.

Figure 2:
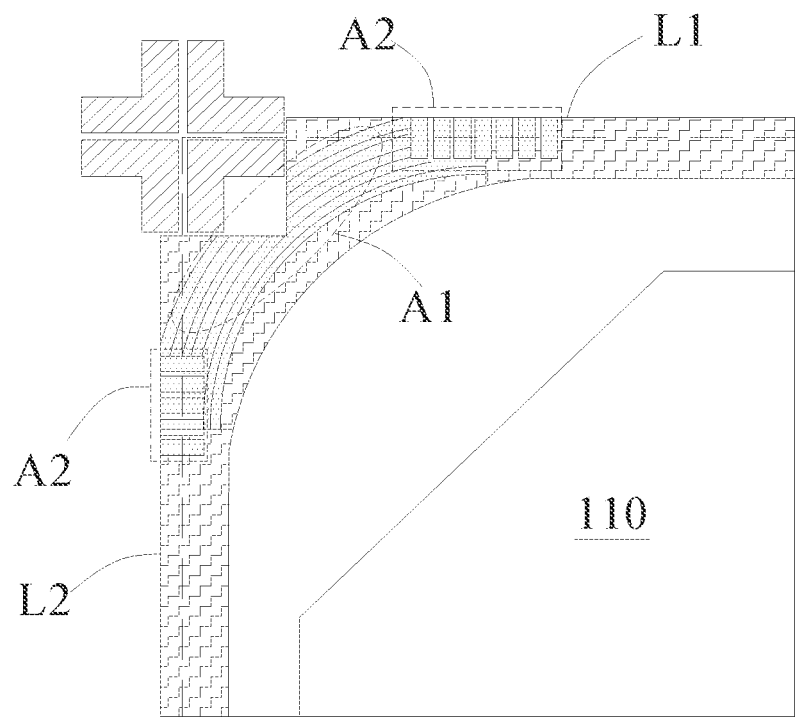
FIG. 2 is an enlarged schematic view of a to-be-processed corner region of the initial display substrate according to an embodiment of the present disclosure.

As shown in FIG. 2, at least one of the processing rounded corner regions includes a first positioning sub-region A1 and two second positioning sub-regions A2, the two major corner sides are outer edges of the two second positioning sub-regions A2, and the first positioning sub-region A1 is disposed between the two second positioning sub-regions A2. It should be noted that the edge of the second positioning sub-region A2 located inside the to-be-processed region 120 is an inner edge of the second positioning sub-region A2.

Figure 3:
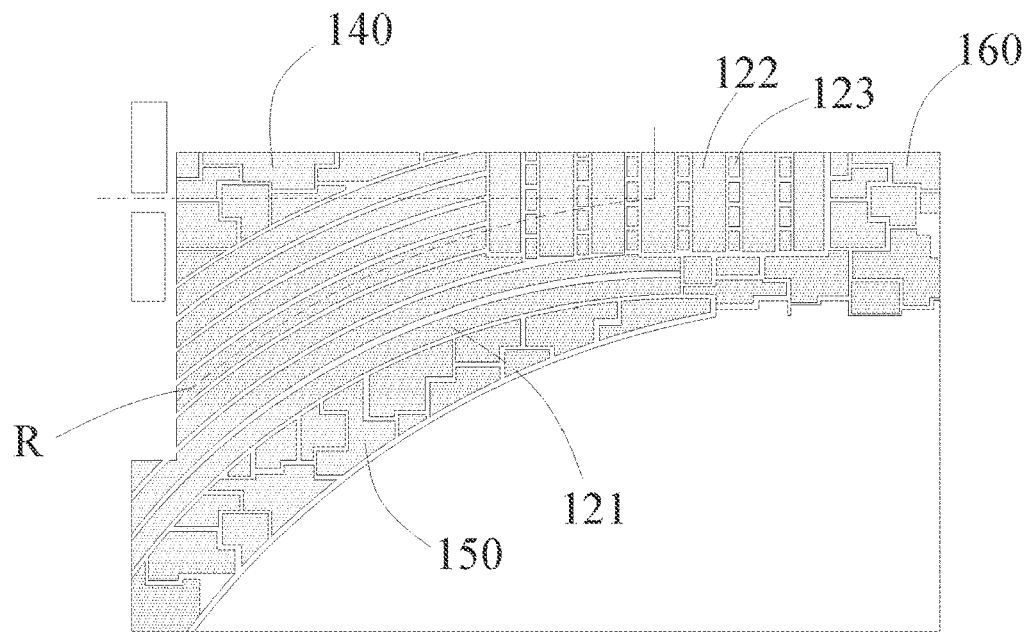
FIG. 3 is a partially enlarged schematic view of the to-be-processed rounded corner region.

As shown in FIGS. 2 and 3, the initial display substrate further includes a plurality of second shielding blocks disposed in the second positioning sub-region A2 and a plurality of first shielding blocks 121 disposed in the first positioning sub-region A1. For example, each of the plurality of first shielding blocks 121 has an arc shape protruding toward a direction facing away from the product region 110, and the plurality of the first shielding blocks 121 are disposed in parallel at intervals. The plurality of second shielding blocks are arranged in a periodic pattern different from a pattern of shielding blocks (e.g., the second auxiliary shielding blocks 160) located in a region of the to-be-processed region 120 other than the plurality of processing rounded corner regions. For example, the plurality of second shielding blocks are provided as rectangular shielding blocks, but the embodiment is not limited thereto. Hereafter, the first shielding block will be described as an arc-shaped shielding block and the second shielding block will be described as a rectangular shielding block as an example.

The initial display substrate according to the present disclosure is used for aligning with a counter substrate and forming an initial display panel. It is noted that the rounded corners obtained by cutting and/or grinding the initial display panel are located in the first positioning sub-region A1. As shown in FIG. 3, a dotted line R is the edge circular arc of the finally obtained rounded corner.

Figure 7:
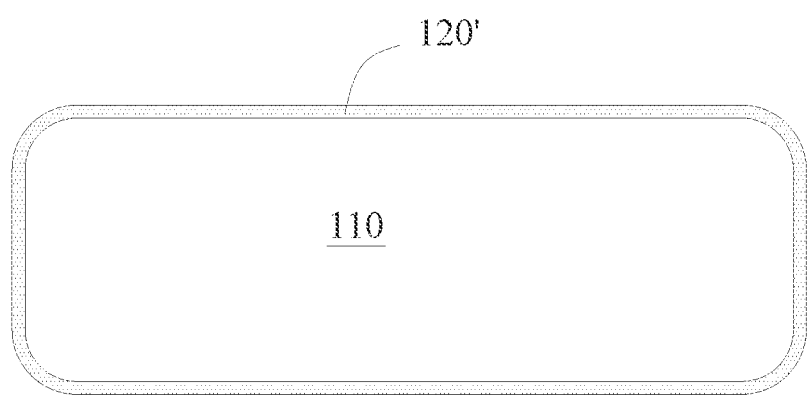
FIG. 7 is a schematic structural diagram of a display panel according to an embodiment of the present disclosure.

When cutting and/or grinding the initial display panel, a portion of the to-be-processed region 120 may be removed, and as shown in FIG. 7, the remaining portion of the to-be-processed region 120 is formed as an edge shielding region 120' of the display panel. Therefore, the rectangular shielding block provided in the second positioning sub-region A2 can also be partially removed. Since the edge shape of the rectangular shielding block is regular and greatly different from the shape of the arc-shaped shielding block, the end point (i.e., the position where the edge circular arc intersects with the remaining portion of the rectangular shielding block) of the edge circular arc of the rounded corner obtained after cutting is also easily recognized by the inspection device. After the inspection device accurately identifies the two end points of the edge circular arc, the radius of the edge circular arc can be calculated. Since the calculation result is accurate, it is possible to accurately determine whether or not the rounded corner obtained by cutting is qualified.

Through applying the initial display substrate according to this disclosure to an initial display panel, it is possible to accurately determine whether the obtained rounded corner is qualified after the process is finished, and consequently, better product management and control can be realized by utilizing the display substrate according to this disclosure.

It is to be noted that in the present disclosure, the positions of the second positioning sub-region A2 and the first positioning sub-region A1 need to be determined according to the size of the edge circular arc of the rounded corner to be finally obtained. An arc-shaped cutting line of the rounded corner formed by cutting is positioned in the range of the first positioning sub-region A1. The tangent forming the rounded arc-shaped cutting line is located within a range of the second positioning sub-region A2. Also, a radian of the arc-shaped shielding block is consistent with a radian of the edge circular arc of the rounded corner to be finally obtained. In addition, the end point of the arc-shaped shielding block should be aligned with the end point position of the rounded corner to be finally obtained. Therefore, the size of the arc-shaped shielding block can be determined according to the size of the corner region of the display panel which is finally required to be obtained.

Figure 4:
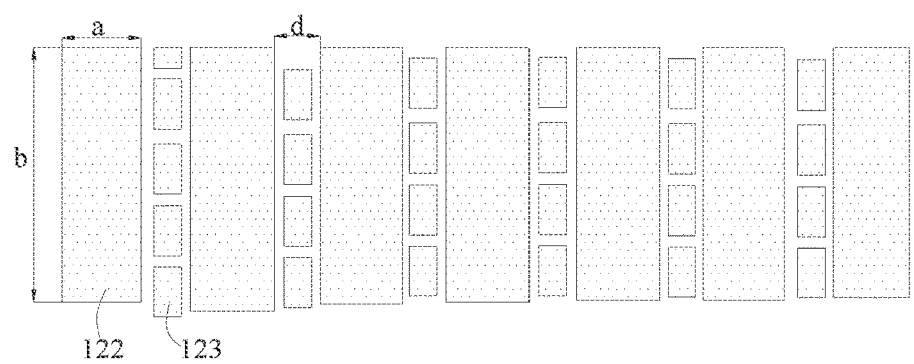
FIG. 4 is a schematic view showing a second shielding block.

In order to make the rectangular shielding block easier to be identified, in some embodiments, as shown in FIGS. 3 and 4, in the second positioning sub-region, the plurality of rectangular shielding blocks include a plurality of first rectangular shielding blocks 122 and a plurality of second rectangular shielding blocks 123, the plurality of first rectangular shielding blocks 122 are arranged along the corresponding major corner side and spaced apart from each other, and at least one second rectangular shielding block is formed between adjacent two first rectangular shielding blocks 122. A distance d between adjacent two first rectangular shielding blocks 122 is smaller than a width "a" (in FIG. 4, the width direction is the same as a direction (i.e., a left-right direction) of the major corner side corresponding to the second positioning sub-region A2 where the plurality of first rectangular shielding blocks 122 are located) of the first rectangular shielding block 122. In some embodiments, a plurality of second rectangular shielding blocks 123 are disposed between adjacent two first rectangular shielding blocks 122, and the plurality of second rectangular shielding blocks 123 are arranged in a direction perpendicular to the corresponding major corner side and spaced apart from each other. Since the first rectangular block 122 has a large size and the second rectangular block 123 has a relatively small size, such combination of the first rectangular block 122 and the second rectangular block 123 is more easily recognized from the image, and it is more convenient to determine the end point of the edge circular arc of rounded corner so that the radius of the rounded edge circular arc determined at the time of inspection is closer to the true radius of the edge circular arc of the rounded corner.

In the present disclosure, the size of the first rectangular block 122 is not particularly limited, and in some embodiments, the width of the first rectangular block 122 is between 40 μm and 60 μm, a length b of the first rectangular block 122 is between 100 μm and 200 μm, and the width direction of the first rectangular block 122 is consistent with a length direction of the major corner side corresponding to the second positioning sub-region where the first rectangular block 122 is located.

As described above, the tangent of the edge circular arc of the rounded corner passes through the second positioning sub-region A2. The allowable size error range for the finally obtained display panel is ±50 μm to ±100 Therefore, the length of the first rectangular shielding block 122 is between 100 μm and 200 μm, and the cutting meets the precision requirement as long as the remaining portion of the first rectangular shielding block can still be seen on the finally obtained display panel after the cutting is completed. In some embodiments, the radius of the edge circular arc of the finally obtained rounded corner region may be 1.5 mm, and accordingly, the radius of the arc-shaped shielding block 121 may be 1.5 mm±(50 μm to 100 μm).

In the present disclosure, a distance between the adjacent two first rectangular shielding blocks 122 is not particularly limited, and in some embodiments, the distance d between the adjacent two first rectangular shielding blocks 122 is between 10 μm and 15 μm. When the size of the distance d is limited to 10 μm to 15 μm, not only the difficulty in manufacturing the first and second rectangular shielding blocks 122 and 123 can be reduced, but also the white edge of the initial display substrate can be well shielded.

Figure 6:
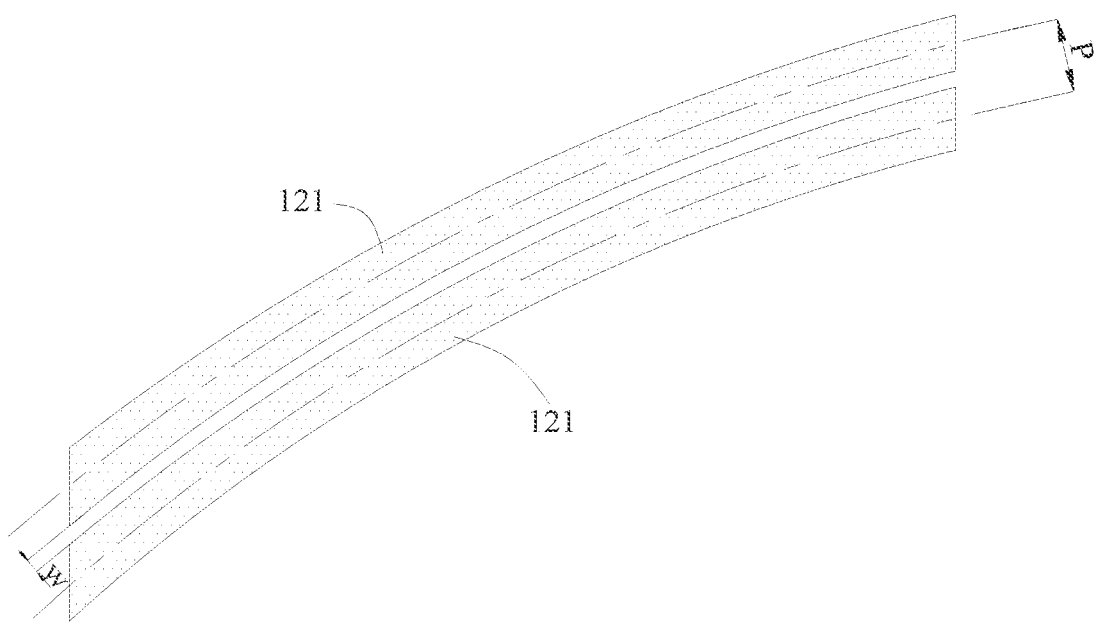
FIG. 6 is a schematic diagram showing a positional relationship between adjacent two first shielding blocks.

In order to obtain a good shielding effect, in some embodiments, in the same first positioning sub-region A1, a plurality of arc-shaped shielding blocks 121 are arranged at equal intervals. Further, a distance w (see FIG. 6) between adjacent two arc-shaped shielding blocks 121 is between 10 μm and 15 μm.

In some embodiments, in the same first positioning sub-region A1, the pitch P (see FIG. 6) of the plurality of arc-shaped shielding blocks 121 is between 45 μm and 55 μm, and in some embodiments, the arrangement pitch P is 50 μm. Here, the "pitch" refers to a distance between width center lines (dotted lines in FIG. 6) of adjacent two arc-shaped shielding blocks 121.

The size of each of the arc-shaped shielding blocks 121 may be determined by defining the pitch P of the arc-shaped shielding blocks and the distance w between adjacent two arc-shaped shielding blocks. For example, the width of each arc-shaped shielding block 121 may be about 40 μm. In the present disclosure, in some embodiments, 5 to 10 arc-shaped shielding blocks are provided in the same first positioning sub-region A1. Disposing 5 to 10 arc-shaped shielding blocks in the same first positioning sub-region can meet a position error of the rounded corner. That is, this cutting has satisfied the required precision as long as there is still remain arc-shaped shielding blocks on the display panel after the cutting is finished. In some embodiments, 7 arc-shaped shielding blocks may be provided in the first positioning sub-region A1.

In some embodiments, 7 arc-shaped shielding blocks may be provided in the same first positioning sub-region A1.

As described above, the first positioning sub-region A1 and the second positioning sub-region A2 are located within the allowable range of the processing accuracy of the cutting line. In order to facilitate identifying whether the rounded corner obtained by processing is qualified, in some embodiments, as shown in FIG. 3, the processing rounded corner region, where the arc-shaped shielding block 121 is disposed, further includes an auxiliary shielding block arrangement sub-region located between the first positioning sub-region A1 and a vertex of a corresponding corner, the auxiliary shielding block arrangement sub-region is provided with non-rectangular first auxiliary shielding blocks 140. After the processing is finished, if the corner is detected to have non-rectangular first auxiliary shielding blocks 140 outside the first positioning sub-region (i.e., on the side of the first positioning sub-region facing away from the product region 110) in addition to the first positioning sub-region A1, it means that the obtained rounded corner has an unqualified size.

In order to reduce the processing difficulty and facilitate the detection of the presence of the rectangular shielding block after processing is completed, in some embodiments, non-rectangular second auxiliary shielding blocks 160 is provided in a region of the to-be-processed region 120 other than the to-be-processed rounded corner region. The shapes of the second auxiliary shielding blocks 160 are greatly different from those of the rectangular shielding blocks, so as to distinguish the second auxiliary shielding blocks 160 from the rectangular shielding blocks and more accurately determine the end position of the edge circular arc of the rounded corner in the acquired image. In some embodiments, third auxiliary shielding blocks 150 may be disposed in an inner region of the arc-shaped shielding blocks 121, and the shapes of the third auxiliary shielding blocks 150 may be consistent with the shapes of the first auxiliary shielding blocks 140. By disposing the third auxiliary shielding blocks 150, the periphery of the product region can be better shielded, and the processing difficulty is reduced.

Before the rounded corner is processed, the processing equipment needs to be aligned, and in some embodiments, a positioning mark may be disposed on the initial substrate. Before starting the processing, the position of the positioning mark is determined.

In the present disclosure, the specific form of the positioning mark is not particularly limited. For example, a pattern for easy recognition may be formed on a non-display region of the initial substrate.

In the present disclosure, the non-display region of the initial display substrate is provided with more shielding patterns, and for easy identification, in some embodiments, a notch may be formed in the corner of the initial display substrate and used as a positioning mark. Specifically, as shown in FIGS. 1 and 2, the initial display substrate further includes two auxiliary corner sides (an auxiliary corner side L3 and an auxiliary corner side L4, respectively) at the corner whose extending directions intersect, so as to form a positioning notch corner with a vertex protruding towards the product region 110 at the corner of the initial display substrate, and the vertex of the positioning notch corner is an intersection of the two auxiliary corner sides.

Figure 5:
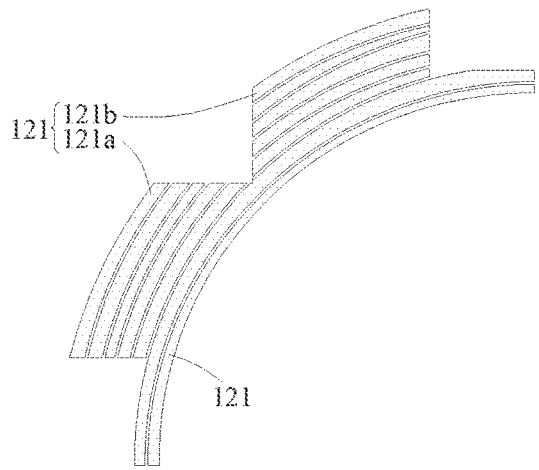
FIG. 5 is a schematic view showing a first shielding block.

In order to capture the positioning notch corner when the processing equipment is aligned, the positioning notch corner should have a relatively large size. To enlarge the size of the positioning notch corner, the vertex of the positioning notch corner may be located inside the first positioning sub-region A1. Accordingly, as shown in FIGS. 2 and 5, the vertex of the positioning notch corner is located within the first positioning sub-region A1, and the arc-shaped shielding block 121 located outside the vertex of the positioning notch corner includes a first arc-shaped shielding block 121a and a second arc-shaped shielding block 121b, that is, the arc-shaped shielding block 121 located at the outer periphery is divided into two parts (i.e., the first arc-shaped shielding block 121a and the second arc-shaped shielding block 121b) by the positioning notch corner.

In the present disclosure, other structures on the initial display substrate are not particularly limited. For example, when the initial display substrate is used as a color film substrate, the initial display substrate may further include a color film layer located in the product region. For another example, the initial display substrate may further include a pixel circuit, a light emitting element, and the like in the product region.

As a second aspect of the present disclosure, there is provided an initial display panel including an initial display substrate and an initial counter substrate aligned with and opposite to the initial display substrate, where the initial display substrate is the initial display substrate provided in the first aspect of the present disclosure.

The initial display panel may be used for forming a liquid crystal display panel. Correspondingly, the initial display panel further comprises a liquid crystal material layer between the initial display substrate and the initial counter substrate. The initial display panel can be provided with a color film layer, and the initial counter substrate can be provided with a pixel circuit array.

The initial display panel may also be used to form an organic light emitting diode display panel, and pixel circuits and light emitting elements may be disposed on the initial display substrate. The initial counter substrate may be a package cover.

Figure 9:
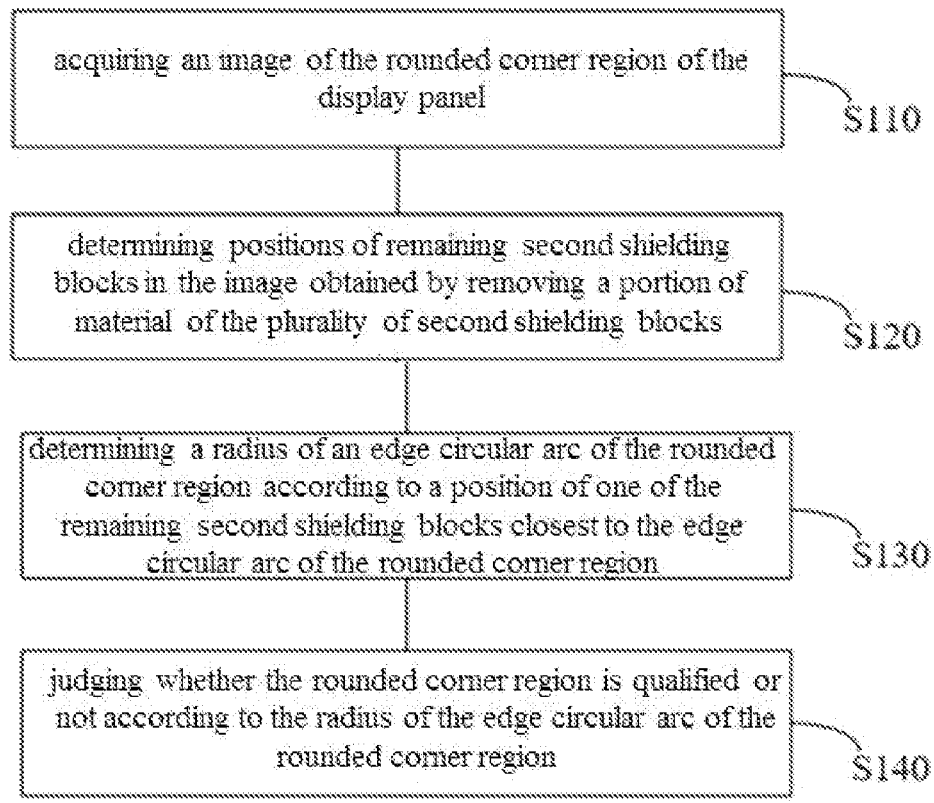
FIG. 9 is a flow chart of an inspection method according to an embodiment of the present disclosure.

As a third aspect of the present disclosure, there is provided a method for inspecting a display panel, and the display panel is obtained by removing a part of at least one to-be-processed rounded corner region of a to-be-processed region of the initial display substrate from the initial display panel provided in the second aspect of the present disclosure and removing a corresponding part on the initial counter substrate. As shown in FIG. 9, the method includes steps S110 to S140.

In step S110, an image of the rounded corner region of the display panel is acquired.

In step S120, positions of remaining second shielding blocks (e.g., rectangular shielding blocks), obtained by removing a part of material of the rectangular shielding blocks, in the image are determined.

In step S130, a radius of the edge circular arc of the rounded corner region is determined according to a position of one of the remaining rectangular shielding blocks closest to the edge circular arc of the rounded corner region.

In step S140, it is determined, according to the radius of the edge circular arc of the rounded corner region, whether the rounded corner region is qualified or not.

As described above, when cutting and/or grinding the initial display panel, a portion of the to-be-processed region 120 is removed, and a corresponding portion on the counter substrate is also removed, and as shown in FIG. 7, the remaining portion of the to-be-processed region 120 is formed as the edge shielding region 120' of the display panel. Therefore, the rectangular shielding blocks provided in the second positioning sub-region A2 are also partially removed. Since the edge shape of the rectangular shielding block is regular and greatly different from that of the arc-shaped shielding block 121, the end point (i.e., the position where the edge circular arc intersects with the remaining portion of the rectangular shielding blocks) of the edge circular arc of the rounded corner obtained after cutting is also easily recognized by the inspection device. After the inspection device accurately identifies the two end points of the edge circular arc, the radius of the edge circular arc can be obtained by calculation. Since the calculation result is accurate, it is possible to accurately determine whether the rounded corner obtained by cutting is qualified.

By adopting the initial display substrate according to this disclosure in the initial display panel, it can accurately determine whether the rounded corner obtained after the processing is finished is qualified, and consequently, the utilization of the display substrate according to this disclosure can realize better product management and control.

In the present disclosure, when the radius of the edge circular arc calculated in step S130 is within the preset radius range, the display panel is determined to be qualified, and when the radius of the edge circular arc calculated in step S130 is not within the preset radius range, the display panel is determined to be unqualified.

Figure 8:
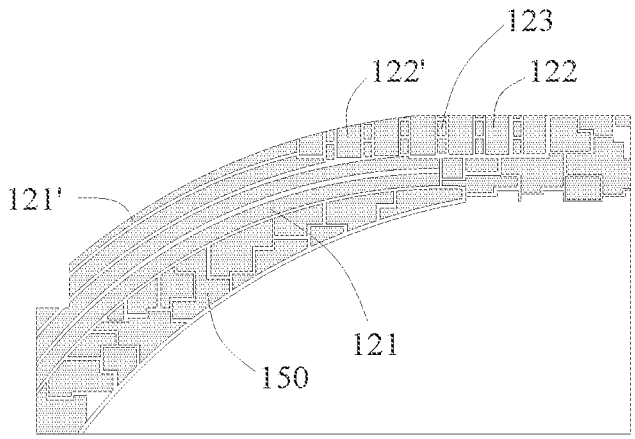
FIG. 8 is a partial enlarged schematic diagram of a rounded corner region of the display panel.

As shown in FIG. 8, some of the arc-shaped shielding blocks 121 are completely removed. In some embodiments, one of the arc-shaped shielding blocks 121 is partially removed, and the residual portion that is not removed, the arc-shaped shielding block 121', remains in the display panel. The arc-shaped shielding block 121' that is not removed may remain in the display panel.

In order to determine whether the display panel is qualified or not more quickly, the determination may be performed by determining whether there are rectangular shielding blocks or the arc-shaped shielding blocks in the image, and identifying the shapes of the rectangular shielding blocks or the shapes of the arc-shaped shielding blocks. If no arc-shaped shielding block exists in the image, it indicates that the to-be-processed region is removed excessively, and the display panel is unqualified. If no rectangular shielding block and even no remaining portion of the rectangular shielding blocks exist in the image, it indicates that the to-be-processed region is removed excessively, and the display panel is unqualified. If all the rectangular shielding blocks are complete, it indicates that the removed portion of the to-be-processed region is too small, and the display panel is unqualified. If the first auxiliary shielding blocks are still reserved on the outer side of the arc-shaped shielding blocks, it indicates that the portion of the removed to-be-processed region is too small, and the display panel is unqualified.

As a fourth aspect of the present disclosure, there is provided a display panel including a display substrate and a counter substrate aligned with and opposite to the display substrate, the display substrate includes a display region and a peripheral region provided around the display region, the peripheral region includes a plurality of rounded corner regions, the plurality of rounded corner regions are respectively provided at a plurality of corners of the display substrate, each of the plurality of corners include two major corner sides whose extending directions intersect. At least one of the plurality of rounded corner regions includes a final first positioning sub-region and two final second positioning sub-regions, the two major corner sides respectively define outer edges of the two final second positioning sub-regions, and the final first positioning sub-region is provided between the two final second positioning sub-regions.

The display substrate further includes a plurality of remaining second shielding blocks (e.g., rectangular shielding blocks) disposed in the final second positioning sub-region and at least one first shielding block (e.g., arc-shaped shielding block) disposed in the final first positioning sub-region, the at least one arc-shaped shielding block has an arc shape protruding toward a direction facing away from the display region, and a radian of the at least one arc-shaped shielding block is consistent with a radian of the edge circular arc of a corresponding rounded corner region. The plurality of remaining second shielding blocks are arranged in a periodic pattern different from a pattern of shielding blocks (for example, black matrix blocks of the display substrate) located in a region of the peripheral region other than the plurality of rounded corner regions.

The display panel is a display panel obtained by removing a part of the to-be-processed rounded corner region of the to-be-processed region from the initial display panel provided in the second aspect of the disclosure. As described above, the production yield is high when the display panel is manufactured.

It will be understood that the above embodiments are merely exemplary embodiments for the purpose of illustrating the principles of the present disclosure, and the present disclosure is not limited thereto. It will be apparent to those skilled in the art that various changes and modifications can be made therein without departing from the spirit and scope of the disclosure, and these changes and modifications are considered to fall within the protection scope of the disclosure.

What is claimed is:

1. An initial display substrate, comprising:
a product region and a to-be-processed region at a periphery of the product region, a portion of the to-be-processed region being to be removed during a cutting of the initial display panel, the to-be-processed region comprising a plurality of to-be-processed rounded corner regions which are respectively at a plurality of corners of the initial display substrate, each of the plurality of corners comprising two major corner sides whose extending directions intersect with each other, at least one processing rounded corner region of the plurality of to-be-processed rounded corner regions comprising a first positioning sub-region and two second positioning sub-regions, the two major corner sides respectively defining outer edges of the two second positioning sub-regions, and the first positioning sub-region being between the two second positioning sub-regions;
a plurality of first shielding blocks in the first positioning sub-region, each first shielding block having an arc shape protruding towards a direction facing away from the product region, and the plurality of first shielding blocks being arranged in parallel at intervals, the plurality of first shielding blocks being configured to determine whether the cutting of the initial display panel meets precision requirement after the initial display panel is cut; and
a plurality of second shielding blocks in each of the two second positioning sub-regions, the plurality of second shielding blocks being arranged in a periodic pattern different from a pattern of shielding blocks in a region of the to-be-processed region other than the plurality of to-be-processed rounded corner regions, the plurality of second shielding blocks being configured to determine a radius of an edge circular arc of a rounded corner obtained by the cutting of the initial display panel.

2. The initial display substrate of claim 1, wherein in the two second positioning sub-regions, the plurality of second shielding blocks comprise a plurality of first rectangular shielding blocks and a plurality of second rectangular shielding blocks, the plurality of first rectangular shielding blocks are arranged along a corresponding major corner side and spaced apart from each other, at least one second rectangular shielding block are between adjacent two first rectangular shielding blocks of the plurality of first rectangular shielding blocks, a spacing between adjacent two first rectangular shielding blocks is smaller than a width of each of the plurality of first rectangular shielding blocks, and a width direction of the plurality of first rectangular shielding blocks is consistent with a direction of a major corner side corresponding to a second positioning sub-region where the plurality of first rectangular shielding blocks are located.

3. The initial display substrate of claim 2, wherein the plurality of second rectangular shielding blocks are between adjacent ones of the plurality of first rectangular shielding blocks, and the plurality of second rectangular shielding blocks are arranged in a direction perpendicular to the corresponding major corner side and spaced apart from each other.

4. The initial display substrate of claim 2, wherein each of the plurality of first rectangular shielding blocks has a width between 40 µm and 60 µm and each of the plurality of first rectangular shielding blocks has a length between 100 µm and 200 µm.

5. The initial display substrate of claim 4, wherein a spacing between adjacent ones of the plurality of first rectangular shielding blocks is between 10 µm and 15 µm.

6. The initial display substrate of claim 1, wherein the plurality of first shielding blocks are arranged at equal intervals in a same first positioning sub-region.

7. The initial display substrate of claim 6, wherein a spacing between adjacent ones of the plurality of first shielding blocks is between 10 µm and 15 µm.

8. The initial display substrate of claim 6, wherein a pitch of the plurality of first shielding blocks is between 45 µm and 55 µm in a same first positioning sub-region.

9. The initial display substrate according to claim 1, wherein 5 to 10 first shielding blocks are provided in the same first positioning sub-region.

10. The initial display substrate of claim 1, wherein the at least one to-be-processed rounded corner region further comprises an auxiliary shielding block arrangement sub-region between the first positioning sub-region and a vertex of the corresponding corner, and the auxiliary shielding block arrangement sub-region is provided with non-rectangular first auxiliary blocks.

11. The initial display substrate of claim 1, wherein the corner of the initial display substrate further comprises two auxiliary corner edges with intersecting extension directions to form a positioning notch corner with a vertex protruding towards the product region at the corner of the initial display substrate, and the vertex of the positioning notch corner is an intersection of the two auxiliary corner edges.

12. The initial display substrate of claim 11, wherein the vertex of the positioning notch corner is within the first positioning sub-region, and the first shielding block outside the vertex of the positioning notch corner is divided into a first arc-shaped shielding block and a second arc-shaped shielding block by the positioning notch corner.

13. An initial display panel comprising an initial display substrate and an initial counter substrate aligned with and opposite to the initial display substrate, wherein the initial display substrate is the initial display substrate of claim 1.

14. A method of inspecting a display panel, wherein the display panel is a display panel obtained by removing a portion of the at least one to-be-processed rounded corner region of the to-be-processed region from the initial display substrate of claim 13 and removing a corresponding portion of the initial counter substrate, the method comprising:
acquiring an image of the rounded corner region of the display panel;
determining positions of remaining second shielding blocks in the image obtained by removing a portion of material of the plurality of second shielding blocks;
determining a radius of an edge circular arc of the rounded corner region according to a position of one of the remaining second shielding blocks closest to the edge circular arc of the rounded corner region; and
determining whether the rounded corner region is qualified or not according to the radius of the edge circular arc of the rounded corner region.

15. A display panel, comprising a display substrate and a counter substrate aligned with and opposite to the display substrate, the display substrate comprising:
a display region and a peripheral region around the display region, the peripheral region comprising a plurality of rounded corner regions respectively at a plurality of corners of the display substrate, each of the plurality of corners comprising two major corner sides whose extending directions intersect, at least one of the plurality of rounded corner regions comprising a final first positioning sub-region and two final second positioning sub-regions, the two major corner sides respectively defining outer edges of the two final second positioning sub-regions, the final first positioning sub-region being between the two final second positioning sub-regions;

at least one first shielding block in the final first positioning sub-region, wherein the at least one first shielding block having an arc shape protruding towards a direction facing away from the display region, and a radian of the at least one first shielding block being consistent with a radian of an edge circular arc of a corresponding one of the rounded corner regions; and a plurality of remaining second shielding blocks in the two final second positioning sub-regions, the plurality of remaining second shielding blocks being arranged in a periodic pattern different from a pattern of shielding blocks in a region of the peripheral region other than the plurality of rounded corner regions, the plurality of remaining second shielding blocks being configured to determine a radius of the edge circular arc.

* * * * *